(12) United States Patent
Ouderkirk et al.

(10) Patent No.: US 9,557,363 B2
(45) Date of Patent: Jan. 31, 2017

(54) LARGE SCALE AUTOMATED TEST SYSTEM RECONFIGURATION

(71) Applicant: The Boeing Company, Chicago, IL (US)

(72) Inventors: James C. Ouderkirk, Kent, WA (US); Adam L. Iseman, Seattle, WA (US); Ryan T. Greenland, Seattle, WA (US); Kenneth L. Kildall, Kenmore, WA (US)

(73) Assignee: The Boeing Company, Chicago, IL (US)

( * ) Notice: Subject to any disclaimer, the term of this patent is extended or adjusted under 35 U.S.C. 154(b) by 132 days.

(21) Appl. No.: 14/666,808

(22) Filed: Mar. 24, 2015

(65) Prior Publication Data

US 2016/0282395 A1 Sep. 29, 2016

(51) Int. Cl.
*G01R 31/02* (2006.01)
*G01R 31/00* (2006.01)
*G01R 1/04* (2006.01)

(52) U.S. Cl.
CPC ........... *G01R 31/008* (2013.01); *G01R 1/0416* (2013.01)

(58) Field of Classification Search
CPC ...... G01R 31/008; G01R 31/02; G01R 1/0416
USPC .......................... 324/537, 750.25, 754, 755, 756.02, 324/756.07, 763
See application file for complete search history.

(56) References Cited

U.S. PATENT DOCUMENTS 5,034,686 A * 7/1991 Aspelin .................. F41G 7/006
102/206
2011/0010157 A1* 1/2011 Baccou ............... G06F 17/5022
703/13

\* cited by examiner

*Primary Examiner* — Tung X Nguyen
*Assistant Examiner* — Neel Shah
(74) *Attorney, Agent, or Firm* — Joseph M. Rolnicki; Evans & Dixon, L.L.C.

(57) ABSTRACT

A large scale automated test system employs one or more relay boxes that contain and support one or more relay boards. Each relay board is operated to selectively communicate an item being designed, for example a cell phone, an automobile, or an aircraft, with two or more electrical components being considered in the design of the item to evaluate the performance of each electrical component in the item being designed.

24 Claims, 11 Drawing Sheets

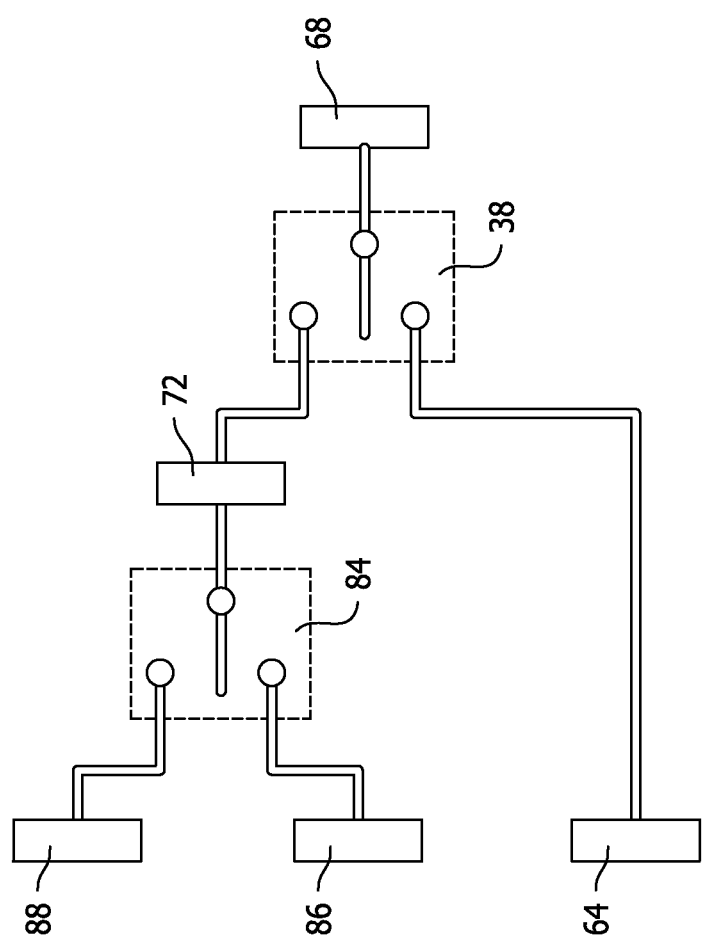

LARGE SCALE AUTOMATED TEST SYSTEM RECONFIGURATION

FIELD

This disclosure pertains to a large scale automated test system. In particular, this disclosure pertains to an automated test system that employs one or more relay cards that are operated to selectively communicate an item being designed, for example a cell phone, an automobile, or an aircraft with two or more electrical components being considered in the design of the item to evaluate the performance of each electrical component in the item being designed.

BACKGROUND

In the design of electrically controlled items that comprise many different types of electrical components, it is often necessary to test and evaluate the performance of each electrical component with the item being designed before the electrical component is manufactured into the item. The testing evaluates the performance of each electrical component with the item being designed, and evaluates the performance of each electrical component with other electrical components in the item being designed. This enables a determination of each electrical component being suitable for use in the item being designed before the design of the item is finalized.

For example, in the design of an aircraft, several different electrical components from different suppliers can go into the design. For example flight control components, navigation components, cabin climate control components, etc. The various different electrical components are electrically communicated through an automated test system with a test version of the aircraft to evaluate the performance of each of the electrical components with the aircraft and with other electrical components used in the design of the aircraft.

For example, flight control electrical components of different suppliers are individually communicated through the automated test system with the test version of the aircraft to evaluate that component's interfacing with the aircraft and the other electrical components of the aircraft to ensure that the particular electrical component will function satisfactorily. The existing ways of electrically communicating the different electrical components and the test version of the aircraft with the automated test system and switching between each of the electrical components to communicate each electrical component individually with the automated test system and the test version of the aircraft are cumbersome, costly and not scalable.

There are various different ways of communicating the electrical components with the automated test system and through the test system with the test version of the aircraft. According to one method, multiple different configurations of cables are built that are manually connected to the electrical component being tested and the automated test system. To selectively switch between the different electrical components of different suppliers, it is necessary to manually disconnect the multiple cables from the electrical component of one supplier and connect the multiple cables to the electrical component of another supplier for the other electrical component to be tested with the test version of the aircraft. This method is disadvantaged in that building multiple different cables needed to communicate the electrical components tested with the test version of the aircraft is both time consuming and labor intensive. Disconnecting the cables from an electrical component and then reconnecting the cables to the next electrical component can result in errors in system functionality of the automated test system. Additionally, manually disconnecting the cables and then reconnecting the cables can take hours. There is a long switch time with risks of misconfiguration (bent pins, cable swaps, etc.). Switching the cables puts wear on the automated test system connector of the cables, limiting the life of the automated testing system.

Another method of communicating each of the electrical components with the automated test system and the test version of the aircraft is to construct a separate patch panel for each of the electrical components to be tested. A separate custom patch panel is used to switch between each of the different electrical components and the automated test system and the test version of the aircraft. This method is disadvantaged in that the custom patch panels are very costly (in hardware used to create each patch panel and in the engineering time needed to create each patch panel). Furthermore, because each patch panel is custom designed for a particular electrical component, the patch panels are very under-utilized. Although, switching one patch panel out for another patch panel to communicate different electrical components with the automated test system does not require as much time as switching cables, switching the patch panels puts wear on the patch panel connectors and limits the life of the patch panel.

A Versa Module Europa (VME) bus based cabinet can also be used to switch between electrical components being tested with a test version of an aircraft through the automated test system. However, the VME cabinets are very costly to construct. The switching requires active control of hundreds of signals of multiple relay channels. The VME bus based cabinet also requires custom cables that are very costly to manufacture to interface the VME cabinet with the automated test system and the test version of the aircraft.

In addition to VME switching mechanisms, there are relay switching mechanisms in VXI (VME extensions for instrumentation), PCI (peripheral component interconnect), PXI (PCI extensions for instrumentation), and LXI (LAN extensions for implementation) formats, to name only a few. All of these share the disadvantages of higher cost per signal, higher power consumption, special interfaces to the test system controller, and custom interface cables to the equipment under test.

Custom interconnect systems have also been constructed to communicate the electrical components through the automated test system with the test version of an aircraft. These interconnect systems employ relays that are built to toggle between the separate electrical components being tested with the test version of the aircraft through the automated test system. However, custom interconnect systems are costly to design and build. They are also physically large, that limits their scalability. Switching between the electrical components requires active control of hundreds of relay signals. There are also hundreds of relays consuming power in normal operation of the custom interconnect system.

SUMMARY

The large scale automated test system of this disclosure provides a way to quickly switch between multiple different electrical components, where the multiple different electrical components are controlled by a computer control of the automated test system that selectively switches between electrical components and a test version of an aircraft. The system is able to test multiple different configurations of electrical components automatically, with little or no switch over time and with a relatively low upfront cost. The system simplifies the ways in which different electrical component configurations can be tested with a test version of an aircraft, enables overall scalability whereby the number of electrical components to be tested with the test version of an aircraft can be increased with the system requiring very low power consumption. The system is controlled by a computer control of the automated test system to communicate distinct configurations of the electrical components being tested with the test version of the aircraft within seconds, compared to the potential hours wasted by switching over cables of current test systems. The system also consumes no power during its normal operation and only a few watts of power as it is being switched.

The features that enable the large scale automated test system to be controlled to communicate particular electrical components with a test version of an aircraft are housed in at least one relay box of the test system. The relay box automates the switching between either a first electrical component or a second electrical component to be tested with the test version of an aircraft. The relay box enables the quick switching between the first electrical component and the second electrical component with the test version of an aircraft, with the switching being done much more quickly than the switching between electrical components of the testing systems described earlier.

The relay box basically contains a plurality of relay boards. The relay boards are large printed circuit boards with each relay board being populated with a plurality of latching relay switches communicated with the printed circuit.

There are a plurality of connectors secured along one edge of each relay board. In the operative environment there are six connectors on the relay board edge. A first of the connectors is communicable through a cable attached to the connector with a first electrical component being tested by the testing system. A second of the connectors is communicable through a cable attached to the second connector with the first electrical component being tested by the testing system. A third of the connectors is communicable through a cable attached to the third connector with the test version of an aircraft. A fourth of the connectors is communicable through a cable attached to the fourth connector with the test version of an aircraft. A fifth of the connectors is communicable through a cable attached to the fifth connector with a second electrical component being tested by the testing system. A sixth of the connectors is communicable through a cable attached to the sixth connector with the second electronic component being tested by the system.

A bank switching apparatus controlled by the computer control of the automated test system is also provided on each relay board. The bank switching apparatus is operable to switch to a first switch state or a second switch state. Where, with the first connector communicating with the first electrical component, with the second connector communicating with the first electrical component, with the third connector communicating with the test version of an aircraft, with the fourth connector communicating with the test version of an aircraft, with the fifth connector communicating with the second electrical component and with the sixth connector communicating with the second electrical component, the computer control of the automated test system controls switching of the bank switching apparatus to the first switched state which communicates the first electrical component through the first and second connectors with the respective third and fourth connectors and the test version of an aircraft. The computer control controlling switching of the bank switching apparatus to the second switched state communicates the second electrical component through the fifth and sixth connectors with the respective third and fourth connectors and the test version of an aircraft.

The relay box is constructed to contain and support a plurality of like relay boards. By increasing the number of relay boards, the testing system is scalable, whereby a large number of electrical components can be tested with the test version of an aircraft. Scaling up or down is as easy as adding relay boards to the relay boxes or removing relay boards from the relay boxes.

As various modifications could be made in the construction of the apparatus and its method of operation herein described and illustrated without departing from the scope of the invention, it is intended that all matter contained in the foregoing description or shown in the accompanying drawings shall be interpreted as illustrative rather than limiting. Thus, the breadth and scope of the present disclosure should not be limited by any of the above described exemplary embodiments, but should be defined only in accordance with the following claims appended hereto and their equivalents.

BRIEF DESCRIPTION OF THE DRAWINGS

Further features of the large scale automated test system are set forth in the following description and in the drawing figures.

FIG. 9 is a schematic representation of the scaleability of the relay boards of the relay boxes.

DESCRIPTION

Figure 1:
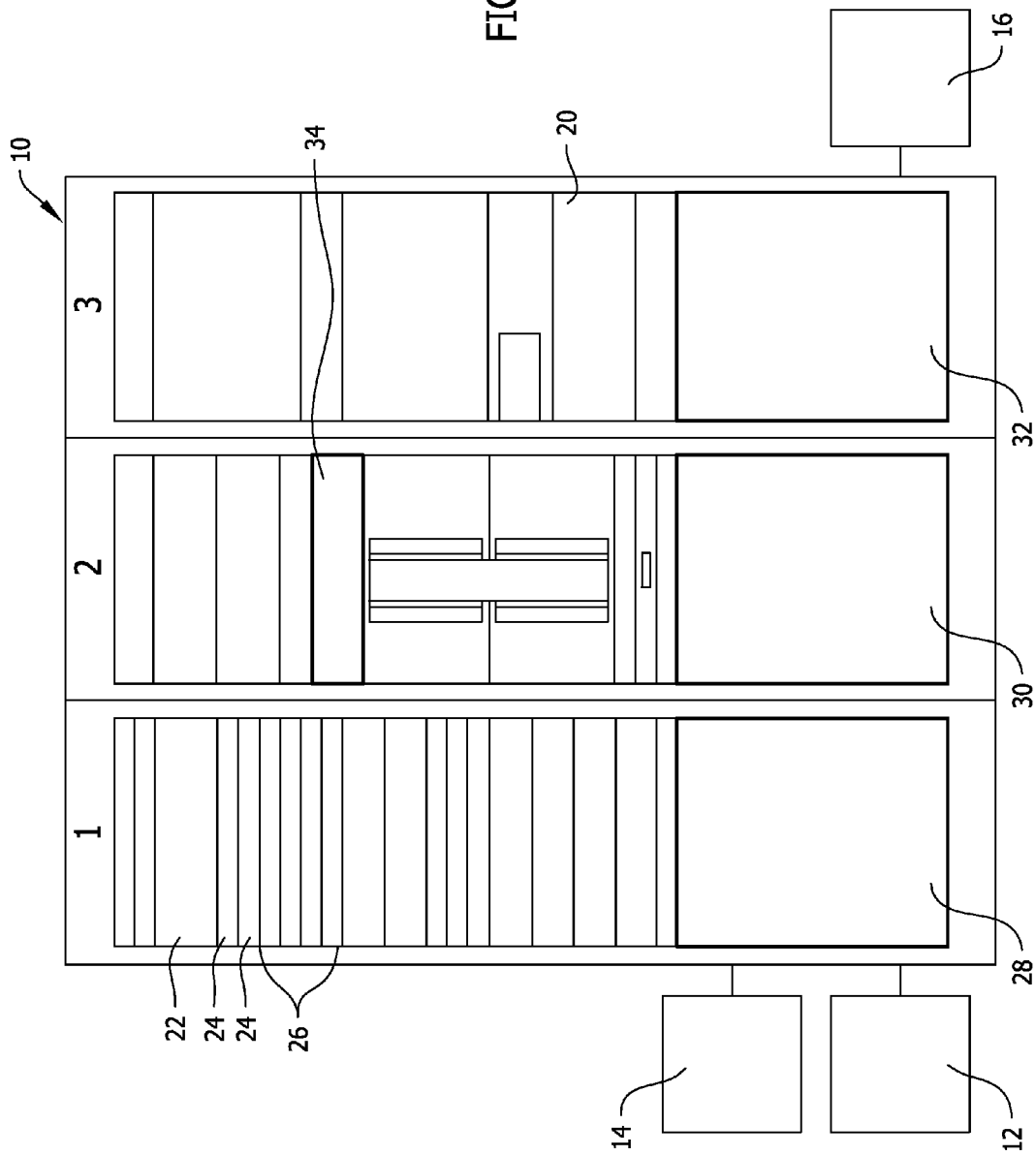
FIG. 1 is a representation of a front elevation view of a large-scale automated test system reconfigured with relay boxes and relay boards of this disclosure.

FIG. 1 is a representation of a large scale automated test system 10 that has been reconfigured with the features of this disclosure to be described. The test system 10 communicates a plurality of different electrical components 12, 14 with a test article 16 through the test system 10. In this disclosure the electrical components 12, 14 are avionics control components and the test article 16 is a test version of an aircraft. However, the concepts of the test system 10 to be described can be used in many other types of test system applications. Although only two electrical components 12, 14 are shown in the schematic representation of the automated test system 10 in FIG. 1, it should be understood that the features of this disclosure reconfigure the automated test system 10 and enable the automated test system 10 to be communicated with multiple different electrical components in addition to the two electrical components 12, 14 represented in FIG. 1, and through the automated test system 10, communicates selected electrical components of the multiple different components with a test version of an aircraft 16.

As represented in FIG. 1, the large scale automated test system 10 is comprised of many different electrical devices found in current test systems such as a power supply 20, a master computer control 22, control panels 24 and programmable power supplies 26, as well as other electronic devices typically found in an automated test system. In addition to the typical features of the automated test system 10, the test system 10 has been reconfigured with three relay boxes 28, 30, 32 and a relay state indicator panel 34 that are the features of this disclosure. The reconfiguration of the automated test system 10 with the relay boxes 28, 30, 32 and the relay state indicator panel 34 enables the test system 10 to quickly switch between electrical components 12, 14 by the operation of the relay boxes 28, 30, 32 and communicate the selected electrical component through the automated test system 10 with a test version of an aircraft 16.

Each of the relay boxes 28, 30, 32 is constructed in the same manner. Therefore, only one of the relay boxes 28 will be described in detail herein. It should be understood that the other two relay boxes 30, 32 have the same construction as the relay box 28 to be described. Additionally, although the automated test system 10 is shown comprising three relay boxes 28, 30, 32, depending on the intended operation of the automated test system 10, the test system 10 could be comprised of one or two relay boxes 28, 30, or could be comprised of more relay boxes than the three relay boxes 28, 30, 32 represented in FIG. 1.

Figure 2:
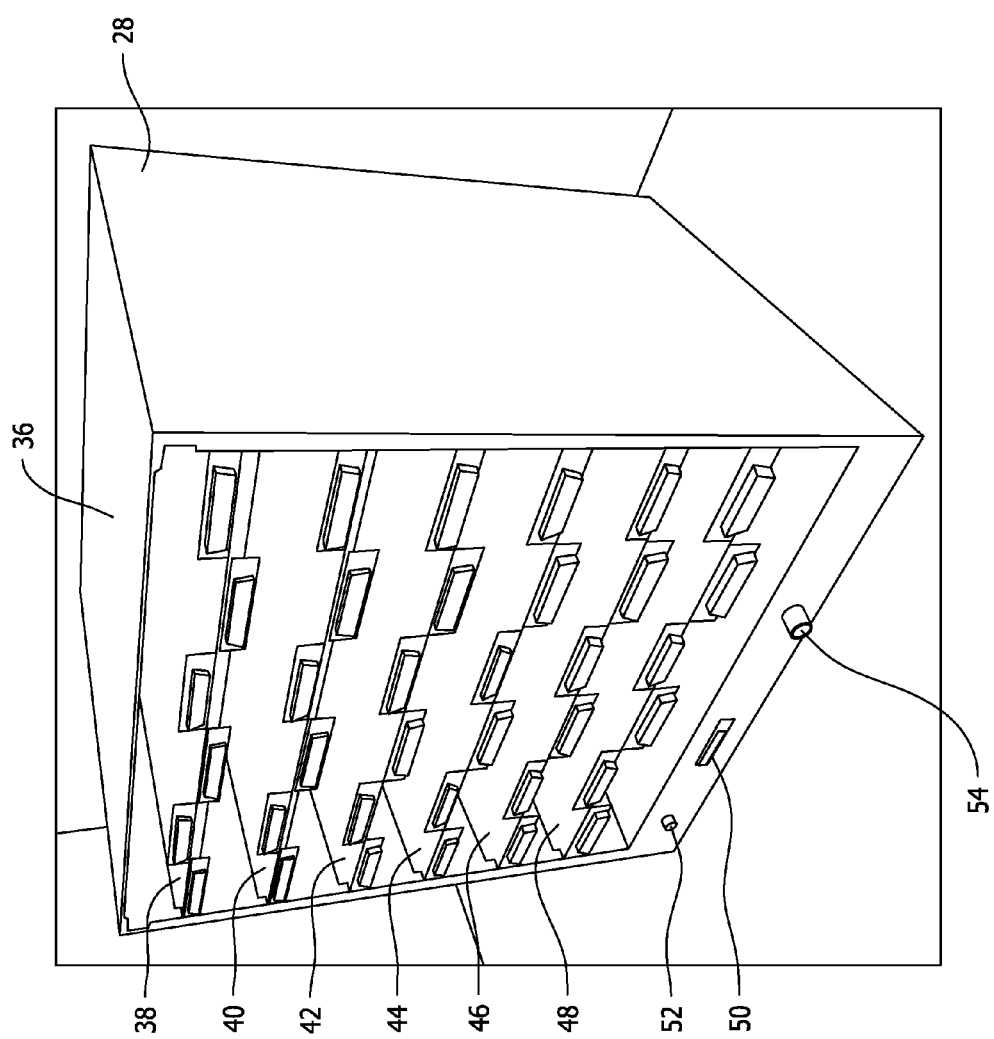
FIG. 2 is a representation of a perspective, elevation view of one of the relay boxes and its associated relay boards removed from the automated test system of FIG. 1.
Figure 5:
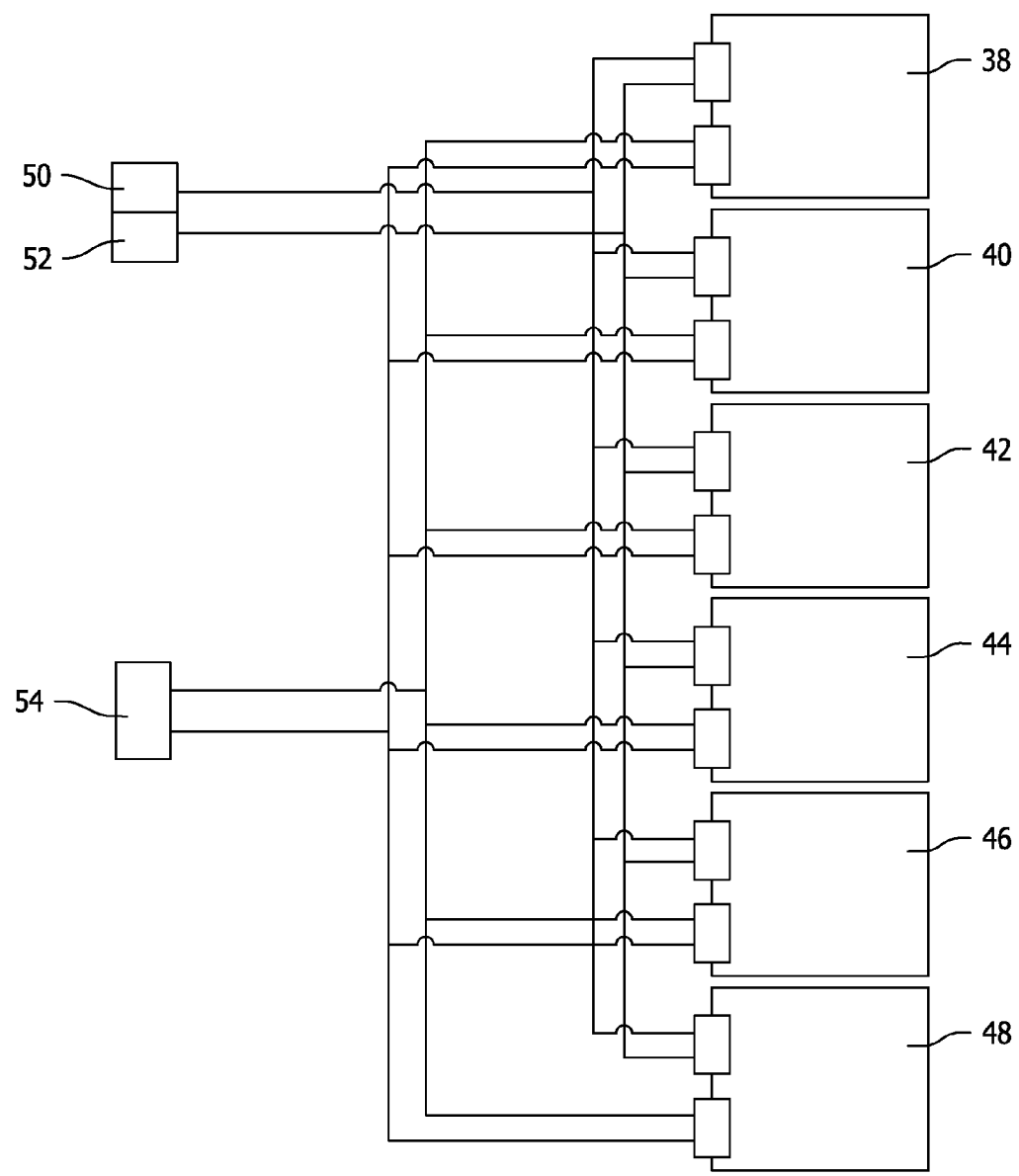
FIG. 5 is a schematic representation of the internal wiring of the relay boards contained in one of the relay boxes.

FIG. 2 is a perspective elevation view of the relay box 28 removed from the automated test system 10 of FIG. 1. The relay box 28 includes a box enclosure 36. The box enclosure 36 contains and supports six relay boards 38, 40, 42, 44, 46, 48. Depending on the intended use of the automated test system 10, there could be fewer relay boards or more relay boards in the relay box than the six relay boards shown. The relay box also has a power input 50 that is connectable through a conductor to the power supply 20 of the automated test system 10. The conductors described herein could be electric signal conductors, optic signal conductors, or any other equivalent type of conductor. The power input 50 communicates power to each of the relay boards 38, 40, 42, 44, 46, 48 from the power supply 20 of the automated test system 10. A ground connection 52 on the relay box 36 is connectable through a conductor to a ground of the automated test system 10. The ground connection 52 grounds each of the relay boards 38, 40, 42, 44, 46, 48 with the ground of the automated test system. Additionally, a computer control interface connection 54 on the relay box 28 is connectable through a conductor to the computer control 22 of the automated test system 10. The computer control interface connection 54 communicates each of the relay boards 38, 40, 42, 44, 46, 48 with the computer control of the automated test system. The computer control interface 54 receives "set" and "reset" communications from the computer control 22 of the automated test system 10. These signals control the operation of each of the relay boards 38, 40, 42, 44, 46, 48 as will be described. These communication connections are represented in the schematic of FIG. 5.

Each of the relay boards 38, 40, 42, 44, 46, 48 has the same construction. Therefore, only one of the relay boards 38 will be described in detail herein. It should be understood that the other relay boards 40, 42, 44, 46, 48 have the same construction as the relay board 38 to be described.

Figure 3:
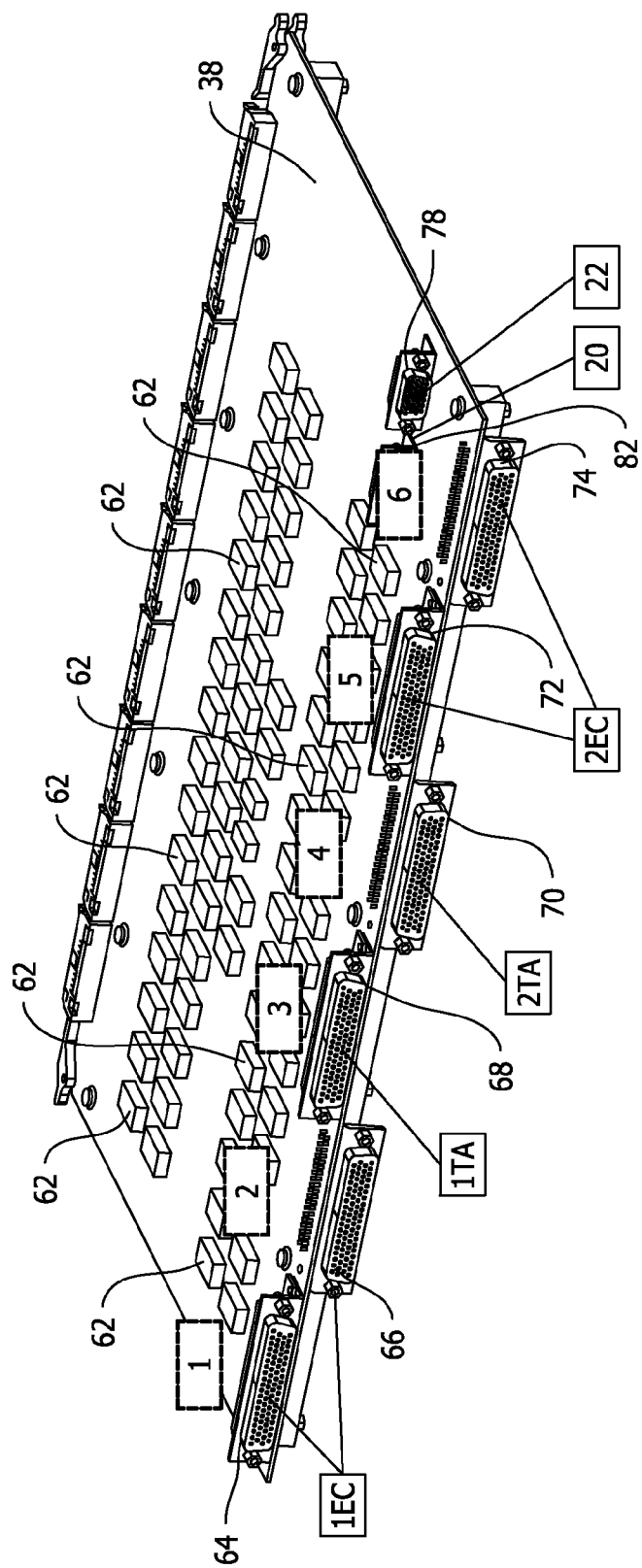
FIG. 3 is a representation of a perspective view of one of the relay boards removed from the relay box of FIG. 2.

FIG. 3 is a perspective view of the relay board 38 removed from the relay box enclosure 36. The relay board 38 is a standard printed circuit board. In the illustrated embodiment, the relay board 38 is 19" wide and is 18" deep. This large relay board 38 enables a large number of latch relay switches 62 to be mounted on the relay board 38 in communication with the printed circuit conductors on the relay board 38. Each of the relay switches 62 is typical in construction and operation and is operable to switch between a first switched state or set condition, or a second switched state or reset condition. Each of the relay switches 62 switches only between the set or reset conditions.

The printed circuit of the relay board 38 also communicates with a plurality of connectors 64, 66, 68, 70, 72, 74 secured to the relay board 38. As represented in FIG. 3, the connectors 64, 66, 68, 70, 72, 74 are secured on opposite sides of the relay board 38 along a rearward edge of the relay board 38 where they are easily accessible for the attachment of conductors to the connectors. In the embodiment of the relay board 38 represented in FIG. 3, each of the connectors 64, 66, 68, 70, 72, 74 is a seventy eight pin standard D connector. Each of the connectors 64, 66, 68, 70, 72, 74 is configured to have sixty eight pins active (thirty four signal wire pairs). Whereby, the single relay board 38 can switch two of the connectors 64, 66, 68, 70, 72, 74, or sixty eight signal wire pairs of the two connectors through sixty eight of the relay switches 62, to the test version of an aircraft 16 across the remaining four connectors on the single relay board 38. Referring to the example of FIG. 3, two of the connectors 64, 72 mounted on the top of the relay board 38 are connectable through conductors with a respective first electrical component 1EC and a second electrical component 2EC to communicate the electrical components 1EC, 2EC through the printed circuit of the relay board 38 and through the relay switches 62 with a connector 68 mounted on the top of the relay board 38 that is connectable through a conductor with the test article TA, or the test version of an aircraft in this example. Two of the connectors 66, 74 mounted on the bottom of the relay board 38 are connectable through conductors with the respective first electrical component 1EC and second electrical component 2EC to communicate the electrical components through the printed circuit of the relay board 38 and through the relay switches 62 with a connector 70 mounted on the bottom of the relay board 38 that is connectable through a conductor with the test article TA, or test version of an aircraft. On operation of the relay switches to their first switch state or set condition, the two connectors 64, 72 on the top of the relay board 38 are communicated with the connector 68 on the top of the relay board. On operation of the relay switches 62 to their second switched state or reset condition, the two connectors 66, 74 on the bottom of the relay board are communicated with the connector 70 on the bottom of the relay board. In the set condition of the relay switches 62 the two connectors 66, 74 on the bottom of the relay board 38 do not communicate with the connector 70 on the bottom of the relay board. In the reset condition of the relay switches 62 the two connectors 64, 72 on the top of the relay board do not communicate with the connector 68 on the top of the relay board.

A relay state control connector 78 is also provided on the relay board 38. The relay state control connector 78 communicates through a conductor connected to the relay state control connector 78 with the computer control 22 of the automated test system 10. The relay state control connector 78 receives signals from the computer control 22 that control the relay switches 62 to move to their set or reset conditions in response to the signals received by the relay state control connector 78 from the computer control 22.

A power connector 82 is also provided on the relay board 38. The power connector 82 communicates through a conductor connected to the power connector 82 with the power supply 20 of the automated test system 10 and supplies power to each of the relay switches 62 to power the switching of the relay switches 62 between their set and reset conditions.

Figure 4A:
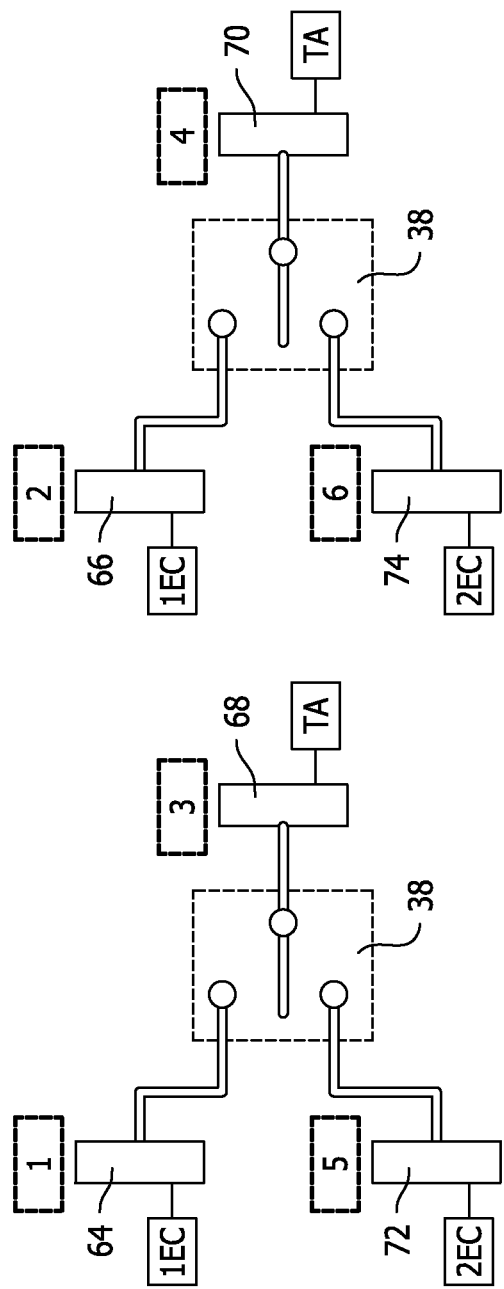
FIG. 4A is a schematic representation of the relay board of FIG. 3.
Figure 4B:
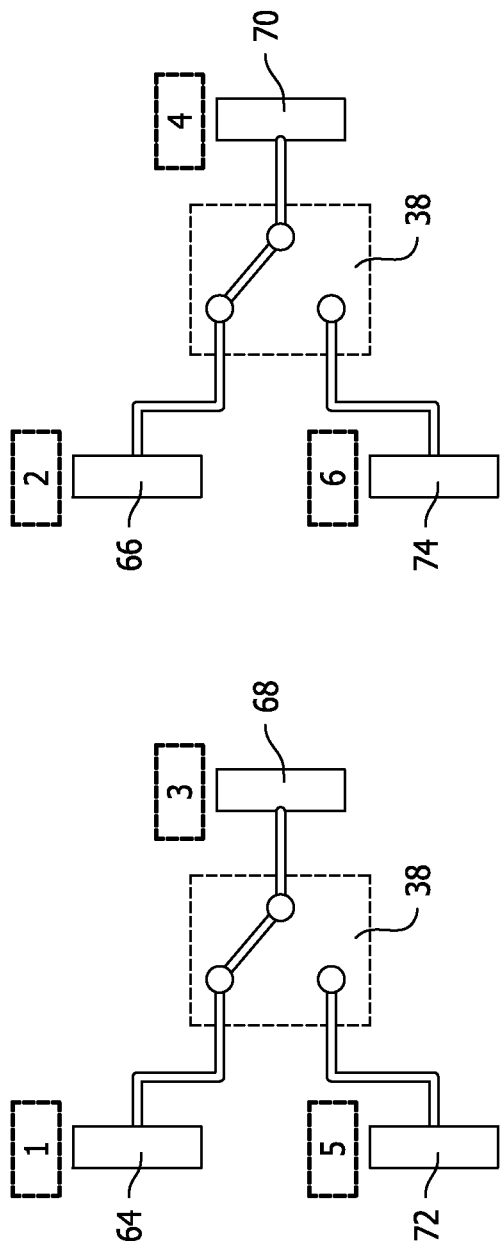
FIG. 4B is a schematic representation of the relay board of FIG. 4A when a set command is sent to the relay board.
Figure 4C:
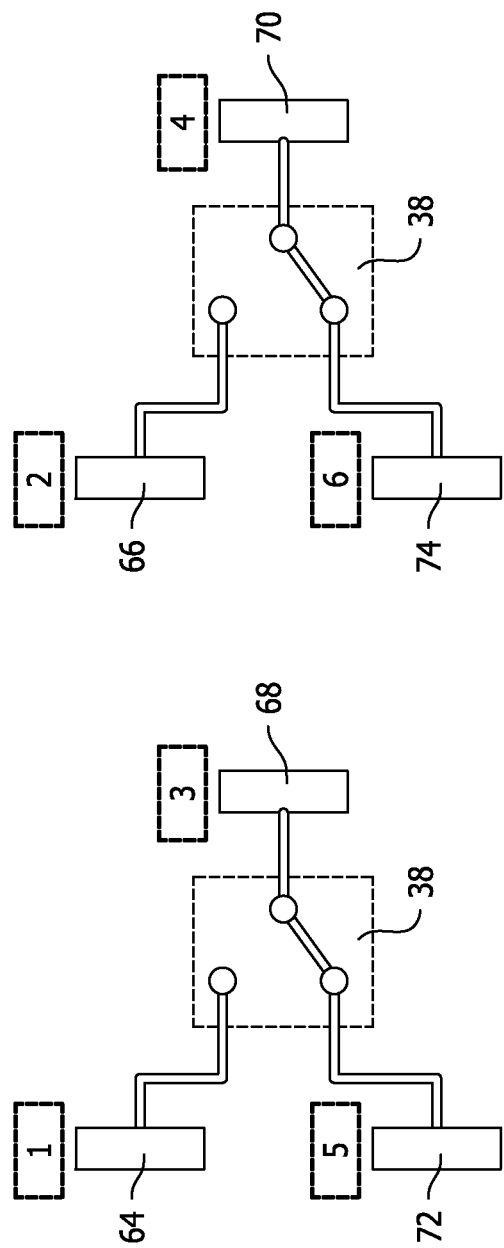
FIG. 4C is a schematic representation of the relay board of FIG. 4A when a reset command is sent to the relay board.

FIG. 4A is a schematic representation of the latch relay switching of the relay board 38 represented in FIG. 3. Based on the relay state control signals, with the set condition signal received by the relay state control connector 78, the relay switches 62 are controlled to communicate the connectors 64 and 66 with the connectors 68 and 70 respectively, which communicate with the test article TA, or the test version of an aircraft in this example. This is represented in FIG. 4B. Thus, the first electrical components 1EC are communicated through the relay board 38 with the test article TA. With the reset condition signal received by the relay state control connector 78, the relay switches 62 are controlled to communicate the connectors 72 and 74 with the connectors 68 and 70 respectively, which communicate with the test version of an aircraft. This is represented in FIG. 4C. Thus, the second electrical components 2EC are communicated through the relay board 38 with the test article TA. In our earlier example, the first electrical components 1EC are communicated through the relay board 38 with the test version of an aircraft TA when the set command is given, and the second electrical components 2EC are communicated through the relay board 38 with the test version of an aircraft TA when the reset command is given. This enables the first electrical components 1EC and the second electrical components 2EC to be quickly switched between the test article TA without requiring the costly and time consuming practice of switching over cables to the first electrical components 1EC and second electrical components 2EC, without constructing separate patch panels for each of the electrical components, without requiring custom interconnect systems or any of the other various different ways of communicating the electrical components through the automated test system with the test version of an aircraft as done in the past. Furthermore, the above example only considers one of the relay boards 38 of the multiple relay boards 38, 40, 42, 44, 46, 48 in only one relay box 28 of the multiple relay boxes 28, 30, 32 employed in the automated test system 10. When considering all of the relay boards and all of the relay boxes in the automated test system 10, it can be seen that the relay boxes 28, 30, 32 and their multiple relay boards can be employed in communicating a large number of electrical components through the automated test system 10 with the test version of the aircraft TA.

Figure 6:
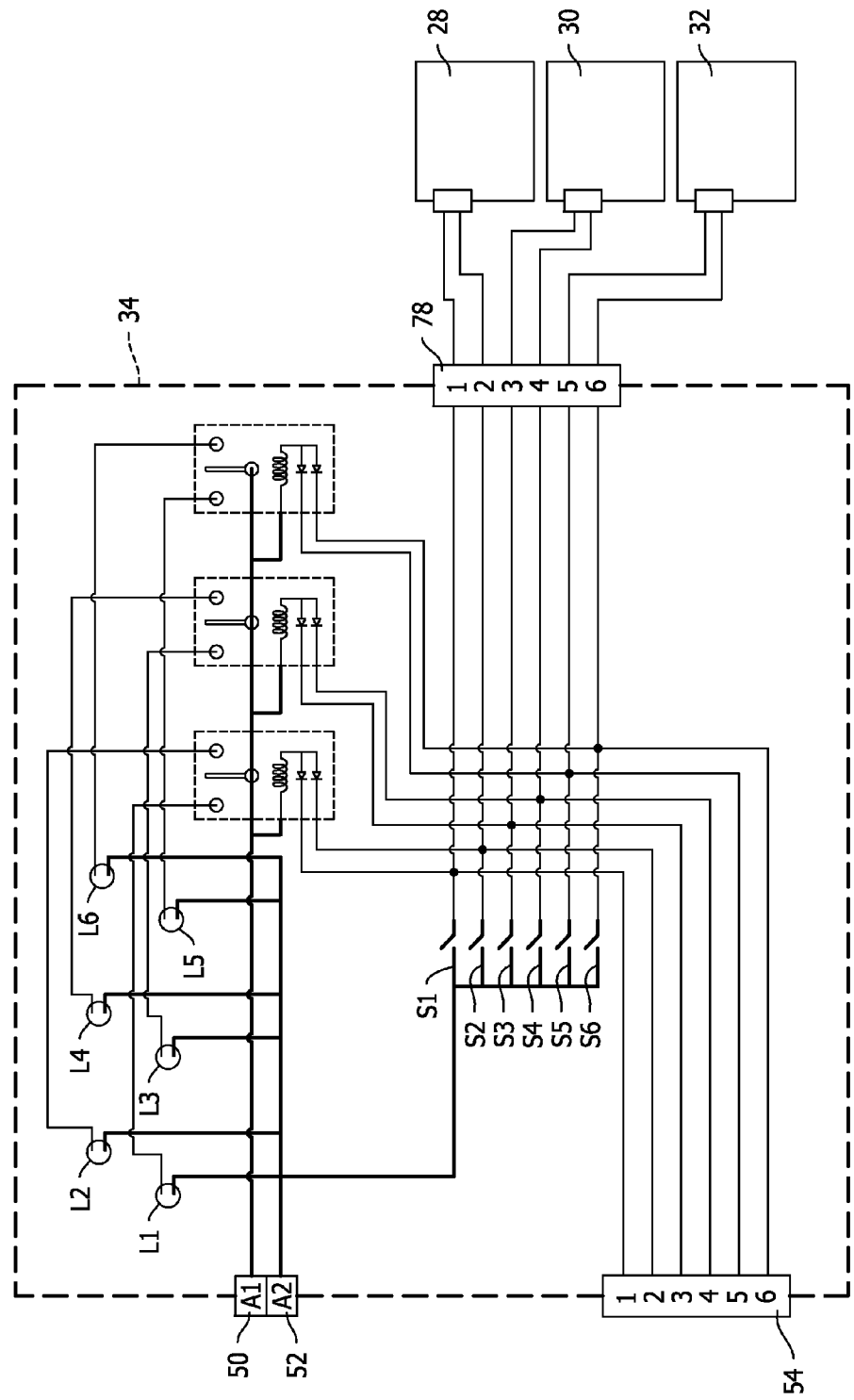
FIG. 6 is a schematic representation of the internal wiring of an indicator panel that communicates with the relay boxes.
Figure 7:
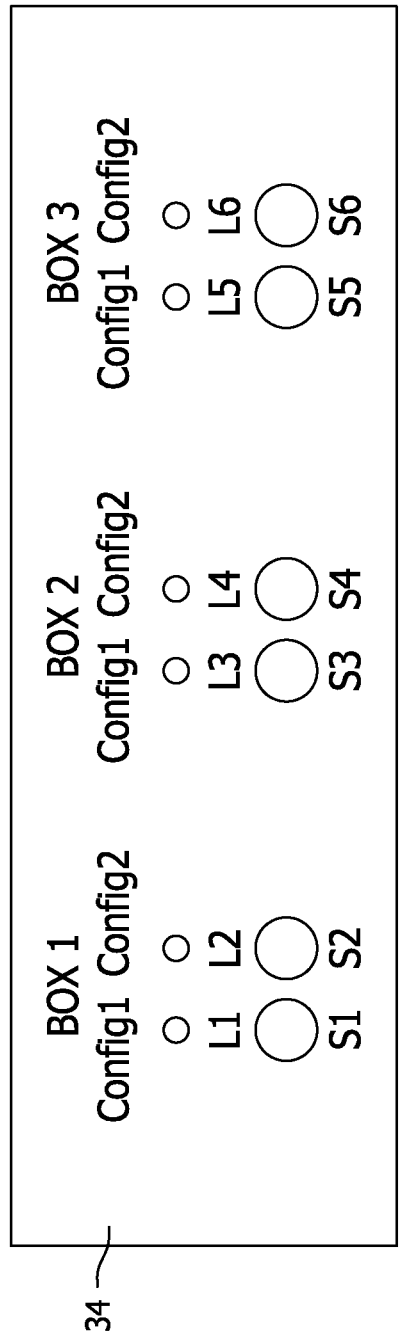
FIG. 7 is a schematic representation of a front elevation view of the indicator panel of FIG. 6.

The communication of set and reset signals to the relay state control connector 78 on the relay board 38 can be controlled by the computer control 22 of the automated test system 10. Alternatively, or in addition to computer control, the communication of set and reset signals to the relay state control connector 78 can be manually controlled at the relay state indicator panel 34. The internal wiring of the relay state indicator panel 34 and its communication with the three relay boxes 28, 30, 32 is represented schematically in FIG. 6. The front of the indicator panel 34 is represented in FIG. 7. As represented in these two figures, the relay state indicator panel circuitry includes six switches S1, S2, S3, S4, S5, S6 on the indicator panel 34. The circuitry also includes six LEDs L1, L2, L3, L4, L5, L6 mounted on the relay state indicator panel 34. As represented in FIG. 7, each of the switches S1, S2, S3, S4, S5, S6 is a manual push button switch that is associated with a respective LED L1, L2, L3, L4, L5, L6. Other types of equivalent manually operable switches could be employed instead of push button switches.

In the manual operation of the automated test system 10, the operator of the test system 10 determines what configuration is needed, or which electrical components are to be communicated with and tested with the test article. If two electrical components are desired to be communicated with the test article and tested with the first test article, the operator presses switches S1, S3, S5, resulting in the LEDs L1, L3, L5 lighting up and resulting in the set condition of the relay boards in the relay boxes. If the operator desires to communicate and test two other electrical components with the test article the operator manually presses the switches S2, S4, S6 causing the corresponding LEDs L2, L4, L6 to light up and causing a reset signal to be sent to the relay boards of the relay boxes. In this manner, various different electrical components can be tested through the automated test system 10 with the test article. The connections are established quickly and require only power to operate the latch relay switches 62. There is no disconnecting of cables and reconnecting of cables involved.

Figure 8:
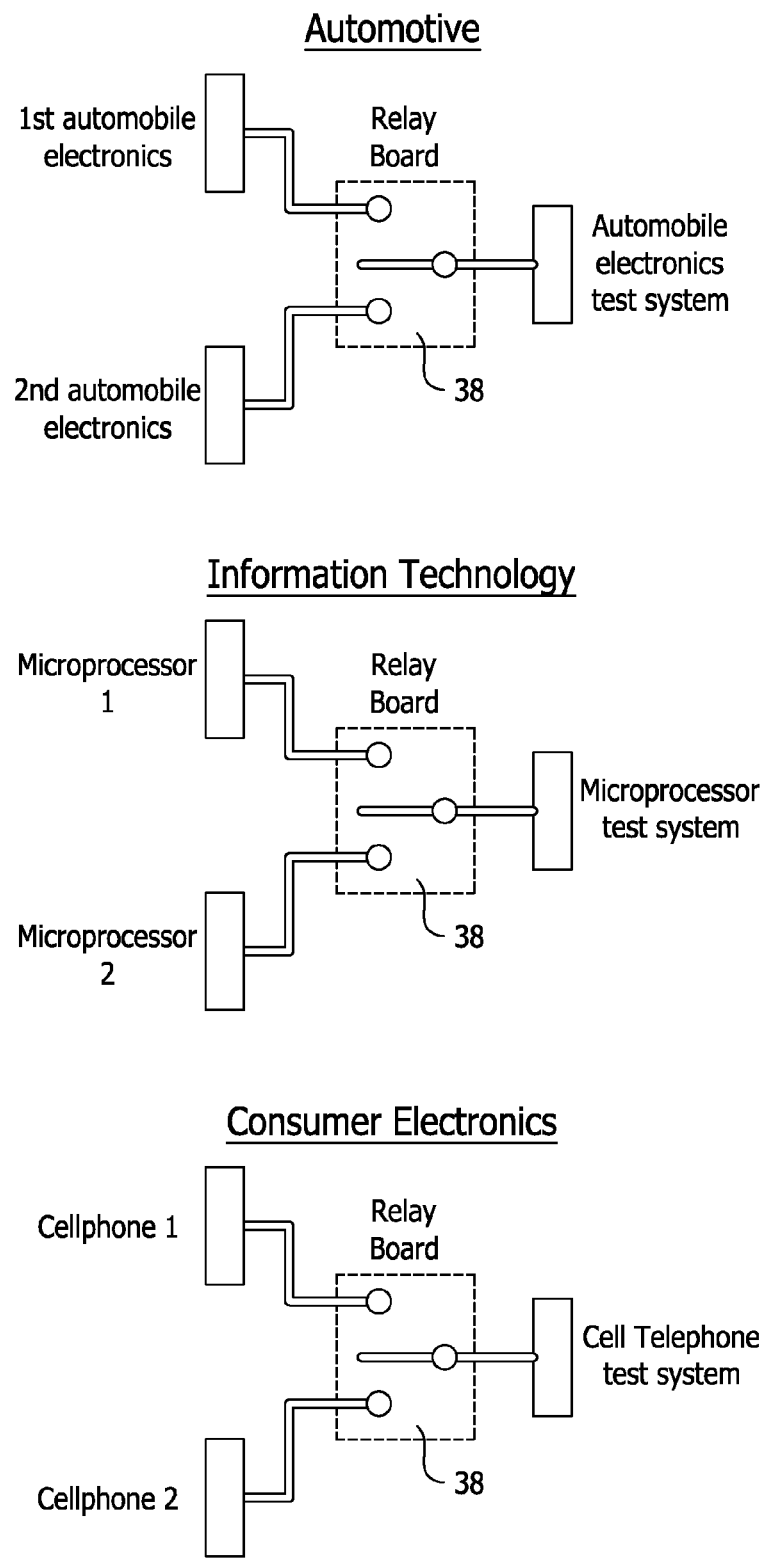
FIG. 8 is a schematic representation of the adaptability of the relay boxes and their relay boards for testing electrical components with various different test systems.

Although the operation of the relay board 38 has been described above in switching between different electrical components that are to be connected with a test article such as a test aircraft, the concept of the relay board 38 can also be applied in other industries. This is represented in FIG. 8. For example, the relay board 38 can be controlled to switch between first and second electrical components that are selectively communicated with an automobile electronics test system. In another example, the relay board 38 can be controlled to switch between first and second microprocessors that are selectively communicated with a microprocessor test system. In a further example, the relay board can be controlled to switch between first and second cell phone electronics that are selectively communicated with a cell telephone test system.

Still further, the relay board 38 is scalable and can be communicated through one of the connectors 72 with an additional relay board 84 as represented in FIG. 9. In the cascading arrangement of the relay boards 38, 84 represented in FIG. 9, a first electrical component communicating with the first connector 64 and second and third electrical components communicating with two electrical connectors 84, 88 of the second relay board 40 can be tested with a test article communicating with the connector 68 of the relay board 38.

The large scale automated test system 10 is able to be commanded into distinct configurations by the computer control 22 within seconds compared to potential hours wasted with the current systems. The large scale automated test system 10 is overall much more scalable than the existing systems, while still maintaining the ease of control and small switch over time. The system 10 also consumes no power during its normal operation and only a few watts as it is switching. The relay board 38 being configured with standardized connectors 64, 66, 68, 70, 72, 74 and relay switches 62 enables a greatly simplified cascading capability so that complex alternative configurations of electrical components can be communicated into a test article or test version of an aircraft in a ground laboratory or a flight-based laboratory test environment.

As various modifications could be made in the construction of the test system and its method of operation herein described and illustrated without departing from the scope of the invention, it is intended that all matter contained in the foregoing description or shown in the accompanying drawings shall be interpreted as illustrative rather than limiting. Thus, the breadth and scope of the present disclosure should not be limited by any of the above described exemplary embodiments, but should be defined only in accordance with the following claims appended hereto and their equivalents.

The invention claimed is:

1. A large scale automated test system comprising:
a relay board;
a first connector on the relay board, the first connector being communicable with a first electrical component;
a second connector on the relay board, the second connector being communicable with the first electrical component;
a third connector on the relay board, the third connector being communicable with a test article;
a fourth connector on the relay board, the fourth connector being communicable with the test article;
a fifth connector on the relay board, the fifth connector being communicable with a second electrical component;
a sixth connector on the relay board, the sixth connector being communicable with the second electrical component; and,
a bank switching apparatus on the relay board, the bank switching apparatus being operable to switch to a first switched state or a second switched state, where with the first connector communicating with the first electrical component, with the second connector communicating with the first electrical component, with the third connector communicating with the test article, with the fourth connector communicating with the test article, with the fifth connector communicating with the second electrical component and with the sixth connector communicating with the second electrical component, switching the bank switching apparatus to the first switched state communicates the first electrical component with the test article and prevents communication of the second electrical component with the test article, and switching the bank switching apparatus to the second switched state communicates the second electrical component with the test article and prevents communication of the first electrical component with the test article.

2. The large scale automated test system of claim 1, further comprising:
the relay board being one relay board of a plurality of relay boards, each relay board of the plurality of relay boards having like first connectors, like second connectors, like third connectors, like fourth connectors, like fifth connectors, like sixth connectors, and like bank switching apparatus.

3. The large scale automated test system of claim 1, further comprising:
the bank switching apparatus being comprised of a plurality of latching relay switches on the relay board.

4. The large scale automated test system of claim 1, further comprising:
a switched state connector on the relay board, the switched state connector communicating with the bank switching apparatus, and the switched state connector being communicable with a computer control of an automated test system.

5. The large scale automated test system of claim 4, further comprising:
a power connector on the relay board, the power connector communicating with the bank switching apparatus, and the power connector being communicable with a power supply of an automated test system.

6. The large scale automated test system of claim 1, further comprising:
the first connector, the second connector, the third connector, the fourth connector, the fifth connector and the sixth connector all being electrical connectors.

7. The large scale automated test system of claim 1, further comprising:
the first connector, the second connector, the third connector, the fourth connector, the fifth connector and the sixth connector being a same configuration connector.

8. The large scale automated test system of claim 1, further comprising:
the first connector, the second connector, the third connector, the fourth connector, the fifth connector and the sixth connector each having signal input connections and signal output connections.

9. The large scale automated test system of claim 1, further comprising:
a relay box; and,
the relay board being supported by the relay box inside the relay box.

10. The large scale automated test system of claim 9, further comprising:
the relay board being one of a plurality of like relay boards; and,
the plurality of like relay boards being supported by the relay box inside the relay box.

11. The large scale automated test system of claim 10, further comprising:
the relay box being one of a plurality of like relay boxes; and,
the plurality of like relay boards being supported by the plurality of like relay boxes inside the plurality of like relay boxes.

12. The large scale automated test system of claim 1, further comprising:
the first electrical component and the second electrical component being a first automobile component and a second automobile component, respectively, and;
the test article being a test version of an automobile.

13. The large scale automated test system of claim 1, further comprising:
the first electrical component and the second electrical component being a first microprocessor component and a second microprocessor component, respectively and;
the test article being a microprocessor.

14. The large scale automated test system of claim 1, further comprising:
the first electrical component and the second electrical component being a first communication component and a second communication component respectively, and;
the test article being a cellular telephone.

15. The large scale automated test system of claim 1, further comprising:
the relay board being a first relay board;
a second relay board;
a seventh connector on the second relay board, the seventh connector being communicable with a third electrical component;

an eight connector on the second relay board, the eighth connector being communicable with a fourth electrical component; and, a ninth connector on the second relay board, the ninth connector being communicable with the first connector on the first relay board.

16. A large scale automated test system comprising:

a relay board;

a first connector on the relay board, the first connector being communicable with a first avionics control component;

a second connector on the relay board, the second connector being communicable with the first avionics control component;

a third connector on the relay board, the third connector being communicable with a test version of an aircraft;

a fourth connector on the relay board, the fourth connector being communicable with the test version of an aircraft;

a fifth connector on the relay board, the fifth connector being communicable with a second avionics control component;

a sixth connector on the relay board, the sixth connector being communicable with the second avionics control component; and, a bank switching apparatus on the relay board, the bank switching apparatus being operable to switch to a first switched state or a second switched state, where with the first connector communicating with the first avionics control component, with the second connector communicating with the first avionics control component, with the third connector communicating with the test version of an aircraft, with the fourth connector communicating with the test version of an aircraft, with the fifth connector communicating with the second avionics control component and with the sixth connector communicating with the second avionics control component, switching the bank switching apparatus to the first switched state communicates the first avionics control component with the test version of an aircraft and prevents communication of the second avionics control component with the test version of an aircraft, and switching the bank switching apparatus to the second switched state communicates the second avionics control component with the test version of an aircraft and prevents communication of the first avionics control component with the test version of an aircraft.

17. The large scale automated test system of claim 16, further comprising:

the relay board being one relay board of a plurality of relay boards, each relay board of the plurality of relay boards having like first connectors, like second connectors, like third connectors, like fourth connectors, like fifth connectors, like sixth connectors, and like bank switching apparatus.

18. The large scale automated test system of claim 16, further comprising:

the bank switching apparatus being comprised of a plurality of latching relay switches on the relay board.

19. The large scale automated test system of claim 16, further comprising:

a switched state connector on the relay board, the switched state connector communicating with the bank switching apparatus, and the switched state connector being communicable with a computer control of an automated test system.

20. The large scale automated test system of claim 19, further comprising:

a power connector on the relay board, the power connector communicating with the bank switching apparatus, and the power connector being communicable with a power supply of an automated test system.

21. The large scale automated test system of claim 16, further comprising:

the first connector, the second connector, the third connector, the fourth connector, the fifth connector and the sixth connector being a same configuration connector.

22. The large scale automated test system of claim 16, further comprising:

the first connector, the second connector, the third connector, the fourth connector, the fifth connector and the sixth connector each having signal input connections and signal output connections.

23. The large scale automated test system of claim 16, further comprising:

the relay board being one of a plurality of like relay boards; and, the plurality of like relay boards being supported by a relay box inside the relay box.

24. The large scale automated test system of claim 23, further comprising:

the relay box being one of a plurality of like relay boxes; and, the plurality of like relay boards being supported by the plurality of like relay boxes inside the plurality of like relay boxes.

* * * * *